United States Patent
James et al.

(10) Patent No.: US 11,024,484 B2
(45) Date of Patent: Jun. 1, 2021

(54) METHOD FOR HIGH SPEED EELS SPECTRUM ACQUISITION

(71) Applicant: Gatan, Inc., Pleasanton, CA (US)

(72) Inventors: Edward Michael James, San Francisco, CA (US); Ray Dudley Twesten, Livermore, CA (US)

(73) Assignee: Gatan, Inc., Pleasanton, CA (US)

( * ) Notice: Subject to any disclaimer, the term of this patent is extended or adjusted under 35 U.S.C. 154(b) by 0 days.

(21) Appl. No.: 16/635,725

(22) PCT Filed: Aug. 1, 2018

(86) PCT No.: PCT/US2018/044786
§ 371 (c)(1),
(2) Date: Jan. 31, 2020

(87) PCT Pub. No.: WO2019/028129
PCT Pub. Date: Feb. 7, 2019

(65) Prior Publication Data
US 2021/0090856 A1   Mar. 25, 2021

Related U.S. Application Data

(60) Provisional application No. 62/541,345, filed on Aug. 4, 2017.

(51) Int. Cl.
*H01J 37/26* (2006.01)
*H01J 37/22* (2006.01)
*H01J 37/24* (2006.01)
*H01J 37/05* (2006.01)
*H01J 37/244* (2006.01)

(52) U.S. Cl.
CPC ............ *H01J 37/268* (2013.01); *H01J 37/05* (2013.01); *H01J 37/224* (2013.01); *H01J 37/244* (2013.01); *H01J 37/265* (2013.01); H01J 2237/2446 (2013.01); H01J 2237/24485 (2013.01)

(58) Field of Classification Search
CPC ........ H01J 37/268; H01J 37/05; H01J 37/224; H01J 37/244; H01J 37/265; H01J 2237/2446; H01J 2237/24485
USPC .................. 250/305, 306, 307, 309, 310, 311
See application file for complete search history.

(56) References Cited

U.S. PATENT DOCUMENTS

| 7,642,513 B2 * | 1/2010 | Pinna ..................... H01J 37/256 250/305 |
| 2005/0285037 A1 * | 12/2005 | Nakamura .............. H01J 37/28 250/311 |

(Continued)

OTHER PUBLICATIONS

International Search Report and Written Opinion issued for the corresponding international application No. PCT/US2018/044786, dated Nov. 19, 2018, 11 pages.

*Primary Examiner* — Nicole M Ippolito
(74) *Attorney, Agent, or Firm* — Snyder, Clark, Lesch & Chung, LLP

(57) ABSTRACT

A system and method are disclosed for acquiring Electron Energy Loss Spectrometry (EELS) spectra in a transmission electron microscope. The inventive system and method maximize spectrum acquisition rate and duty cycle by exposing a first portion of an image sensor to a first spectrum while a previously exposed potion of the sensor is read out of the sensor during some or all of the exposure time.

19 Claims, 8 Drawing Sheets

(56) References Cited

U.S. PATENT DOCUMENTS

2012/0049060 A1\* 3/2012 Luecken ................ H01J 37/26
   250/305
2017/0125210 A1\* 5/2017 Henstra .................. H01J 37/14

\* cited by examiner

METHOD FOR HIGH SPEED EELS SPECTRUM ACQUISITION

CROSS-REFERENCE TO RELATED APPLICATIONS

This application claims priority under 35 U.S.C. § 119 based on U.S. Provisional Patent Application No. 62/541,345 filed Aug. 4, 2017, the disclosure of which is hereby incorporated by reference herein.

BACKGROUND

Electron Energy Loss Spectrometry (EELS) spectrum acquisition in a transmission electron microscope (TEM) exposes a sensor with a spectrum of electrons that have traversed a thin specimen.

Typically, in a TEM configured for use in EELS, there is an energy-dispersing device, referred to sometimes as a "prism," which is analogous in effect to an optical prism, which disperses incoming light of mixed frequencies by wavelengths, whereas in EELS, electrons of differing energy levels are dispersed by the device by energy level across a detector. An EELS device also includes energy shifters after the prism, which can shift the dispersed electron spectrum to expose the image sensor to a desired portion of the full energy spectrum. While a spectrum can be sensed as a one dimensional phenomenon, in EELS, to avoid sensor damage by high energy electrons, a two dimensional pixel array is often used wherein the electron spectrum is typically defocused over multiple pixels in a non-dispersive direction FIGS. 2 and 2A show typical prior art timing of imaging sensor exposure and readout. The top chart 210 and close up of the read/reset timing in FIG. 2A, show the sensor readout periods 211 (time frame R) and periods where there is no read-out 212 (time frame E) timing, with the spectrum height in pixels, s. Typical image sensors read-out rows of pixels sequentially. With the sensor oriented such that rows are orthogonal to the y axis, such read-out can be represented as a y-position of the read versus time as is done on the top chart 210. For an active-pixel CMOS sensor imaging continuously, rows are typically read out one at a time and then each read-out row is immediately reset, to begin exposure for the next frame. This is an example of a so-called "rolling-read" mechanism.

FIG. 2A shows a detailed view of the diagonal lines 213 in FIG. 2 approximating row reads and resets. In FIG. 2A, individual row reads are shown as triangles and row resets as circles. Read operations on each row are followed by a reset of that row. In the top chart 210 of FIG. 2, the read-out is happening in a region of interest (ROI) or read-out height of a number of rows on the sensor in the y-direction that extends from a y value, or row number of 0 through a y value or row number of s. Depending on the value of s and the choice of row number to use as origin, 0, this read-out range can correspond to any ROI in the non-dispersive direction, from a narrow strip to the entire height of the sensor. Typically, the read-out height is sized to match the height of the spectrum as shown in FIG. 1A.

Chart 210 also shows periods 212 where there is no sensor read-out process taking place. During these times, the sensor is typically being exposed to a signal such as an EELS spectrum. Periods of exposure without read out enable the sensor to extend the exposure time beyond the time it takes to do one read-out of the sensor. The second chart 220 shows timing for a blanking trigger signal (solid line) and the delayed blanking system response (dashed line). The bottom chart 230 shows a probe advance trigger signal (solid line) and probe advance system response (dashed line.) In both cases 220 and 230, a delay between trigger signal and response is shown to represent latencies in the system, for instance, time constants associated with reactance of the electron optics being energized in response to the trigger requests. In the prior art, sensor readout 211 (time frame R) is stopped or paused while the exposure 212 (time frame E) takes place. After the exposure, the signal is read out of the device (charge transfer in the case of a CCD; active pixel readout in the case of CMOS.) During the read-out process there is no exposure taking place and spectrum acquisition time is lost. The duty-cycle (spectrum exposure time/total time) and spectrum acquisition rate are therefore both significantly limited when the exposure time is of the order of, or shorter than read-out time. In FIG. 2, the exposure time is approximately the same as the readout time and so duty-cycle in that example is about 50%.

High duty cycle is extremely desirable. Without it, experiments take longer and sample damage occurs more severely for any given total spectrum exposure on the sensor. CCD read-out and common CMOS read-out times are typically of the order of milliseconds (ms). The duty cycle tends to zero when spectrum acquisition rate reaches a limit defined by 1/R spectra per second (sps) where R is the sensor readout time and where no exposure time is possible. Commonly this is at around 1000 sps. Known methods to speed up the read-out such as pixel binning in the non-dispersive direction often degrade the signal quality and/or decrease signal-to-noise ratio. An alternative solution is the use of dedicated high speed sensors, such as high-dynamic-range pixel arrays with high aspect ratios, but installation of these sensors prevents the system from being useable as a 2D imager and can add to the cost and complexity of the system in other ways. Thus, a method of acquiring EELS spectra that enables a higher exposure to process time duty cycle is desirable.

BRIEF DESCRIPTION OF THE DRAWINGS

The accompanying drawings, which are incorporated in and constitute a part of this specification, illustrate one or more embodiments described herein and, together with the description, explain the embodiments. In the drawings.

DETAILED DESCRIPTION OF PREFERRED EMBODIMENTS

Figure 2:
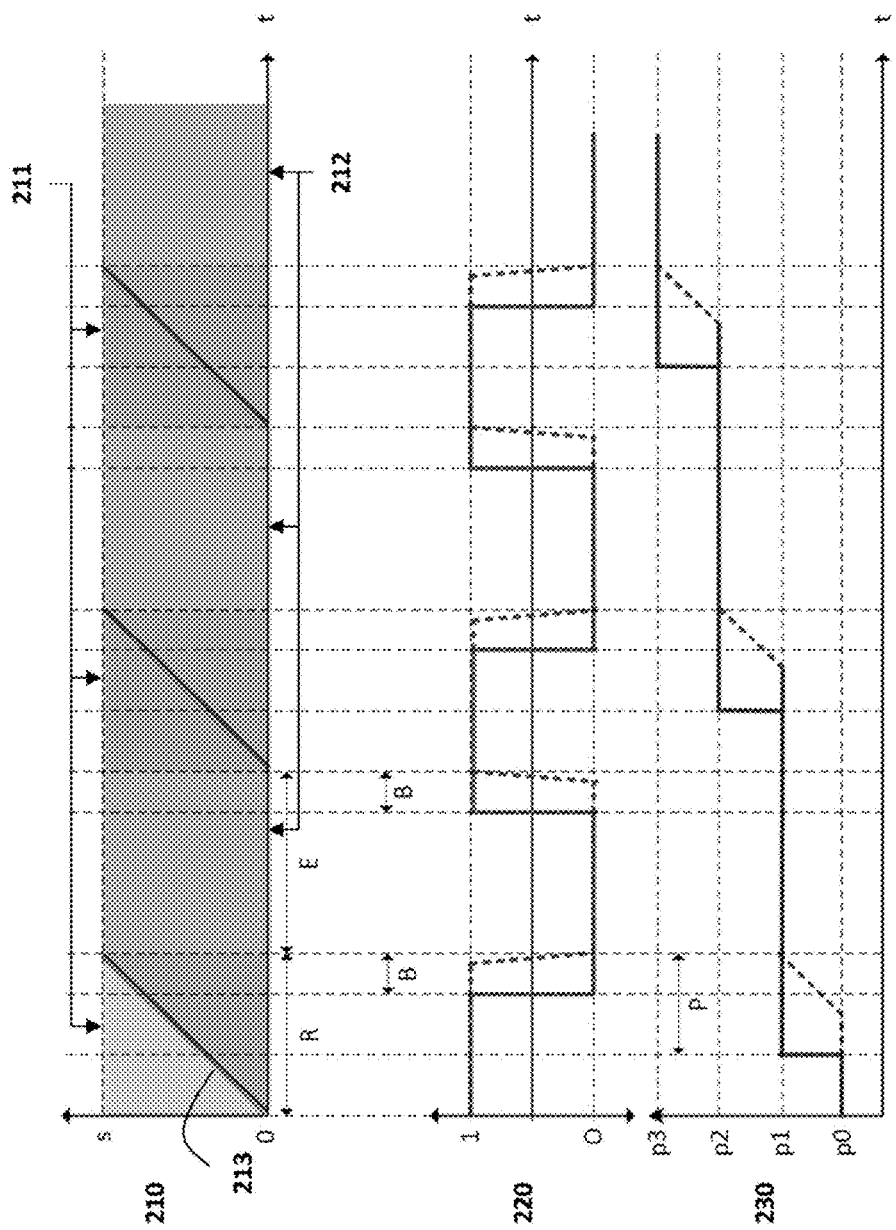
FIG. 2 is a prior art imaging sensor timing diagram.
Figure 2A:
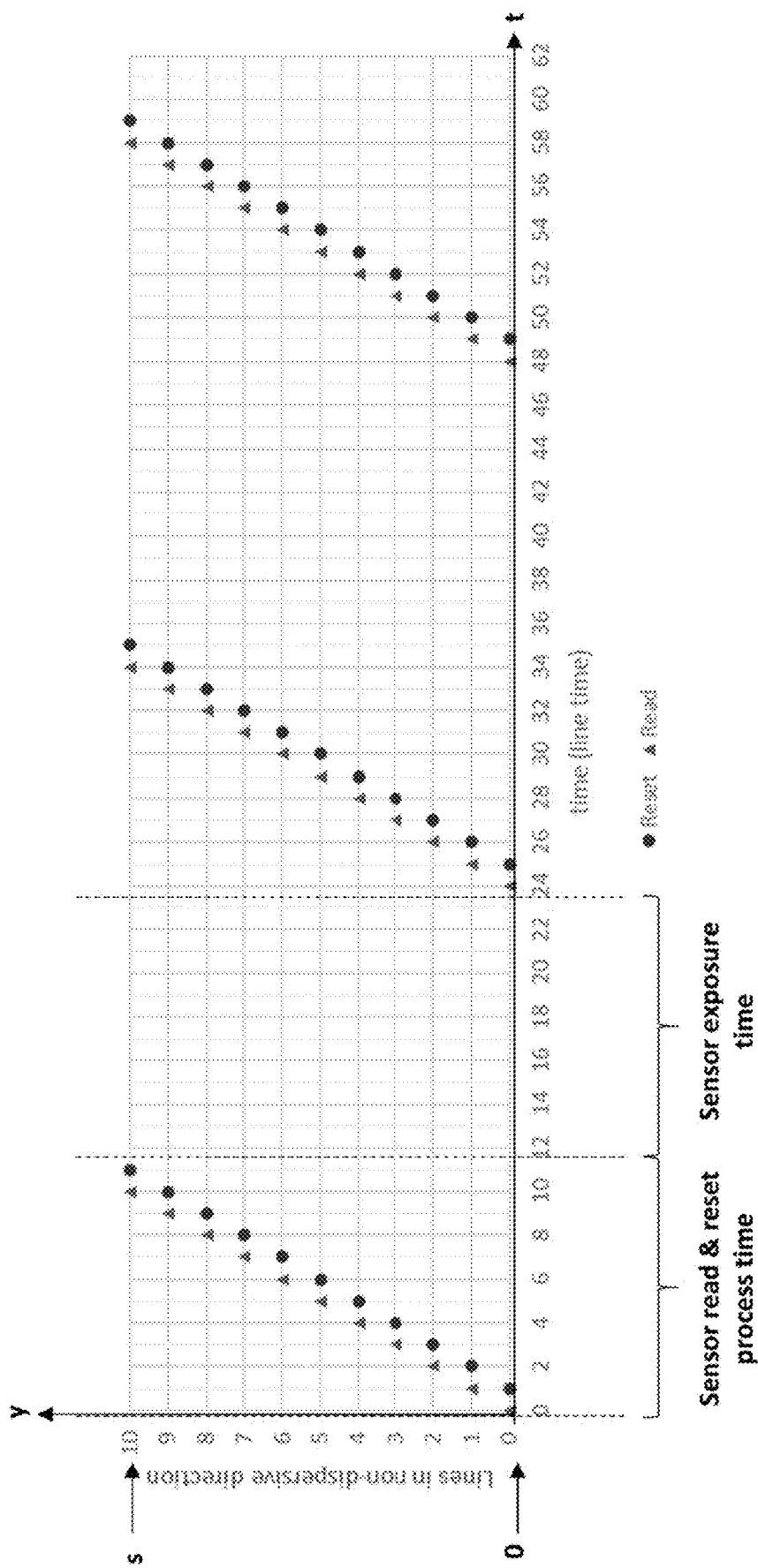
FIG. 2A is an enlarged view of the read reset portion of the diagram of FIG. 2.

The following detailed description refers to the accompanying drawings. The same reference numbers in different drawings identify the same or similar elements. Although the reference numbers used in FIG. 2 are reused in FIG. 3 for convenience, it should be noted that the components or values identified by the reference numbers are not identical.

Figure 1:
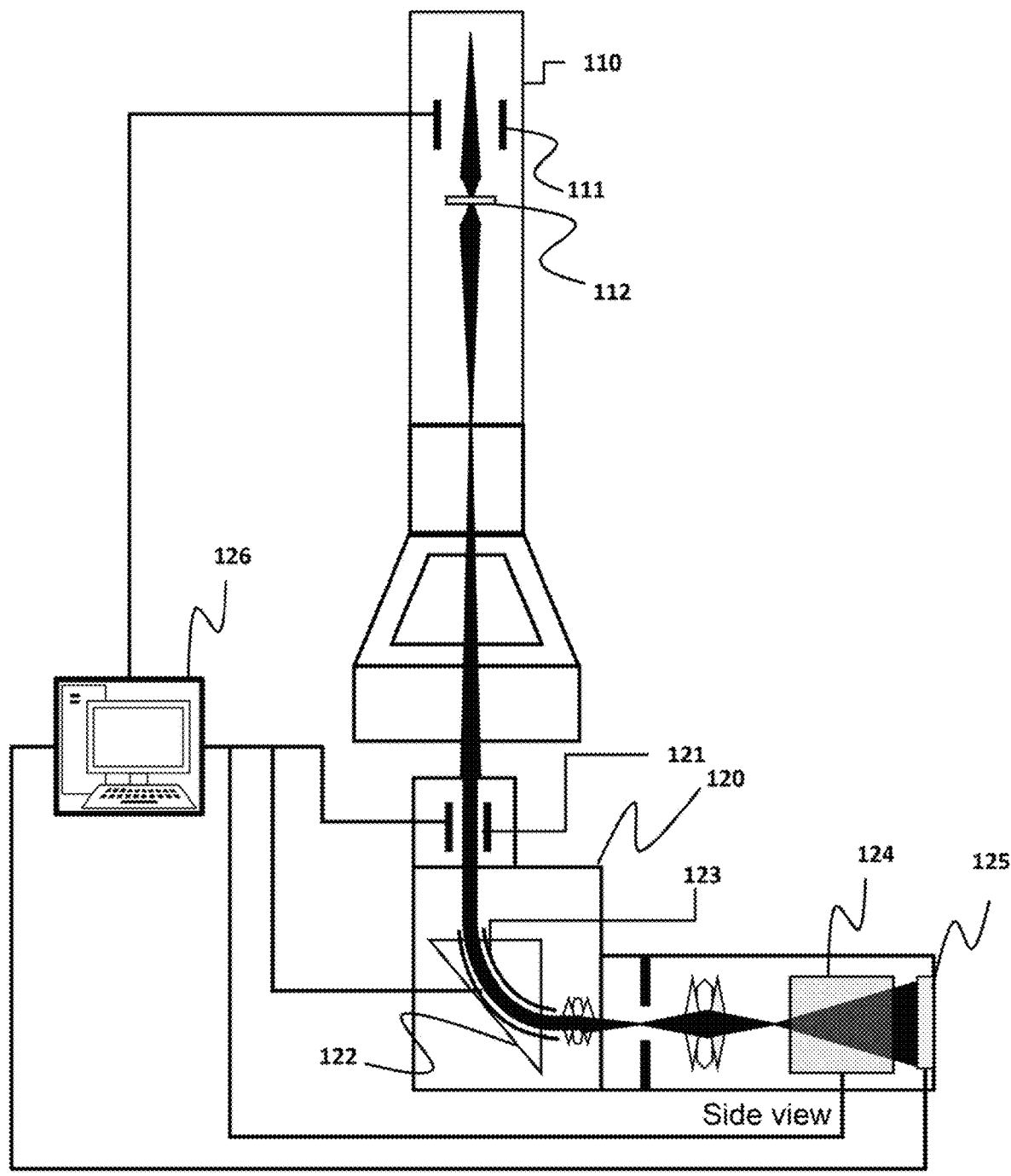
FIG. 1 is diagram of a prior art transmission electron microscope having an electron energy loss spectrometer.

FIG. 1 shows an exemplary TEM fitted with an EELS spectrometer, with components that are relevant to the present invention shown. An exemplary TEM 110 used with the inventive processes includes a microscope/probe deflector 111 positioned above a specimen 112. A spectrometer 120 placed after the specimen includes one or more beam blankers 121, an energy-dispersing prism 122, one or more energy shifters 123, one or more spectrum deflectors 124 and an image-receiving device such as a pixel array sensor 125. One or more microcontrollers or computers 126 are connected to and control the deflectors 111, beam blankers 121, energy shifters 123 and spectrum deflectors 124 and are connected as well as to the pixel array 125 to receive the image produced by it.

Figure 1A:
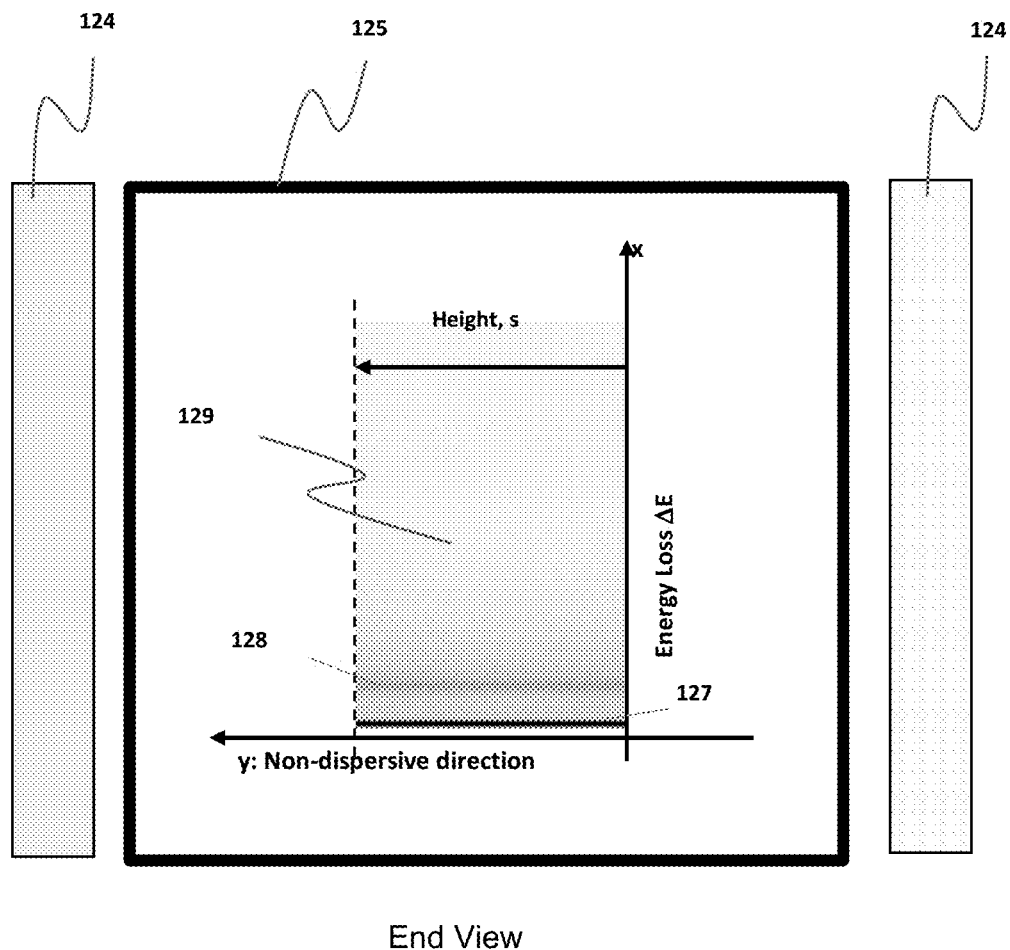
FIG. 1A is an end-on view of the sensor and deflection plates of FIG. 1 illustrating the dispersive and non-dispersive directions for an image of an EELS spectrum.

FIG. 1A is an end view of the sensor 125 of the exemplary device of FIG. 1, in which the energy-dispersive, or x axis for the spectrum runs from bottom to top of the sensor, and the non-dispersive, or y axis for the spectrum runs from left to right. Spectrum deflectors 124 are also shown in FIG. 1A. Typically, a two-dimensional imaging sensor (such as a charge coupled device (CCD) or active-pixel CMOS sensor) is used to acquire the spectrum, 129, dispersed in energy in the x-direction across most/all of the sensor.

To avoid sensor damage by high energy electrons, spectrum 129 is typically defocused over multiple pixels in the non-dispersive y-direction. The extent of the y-direction defocus determines the specimen height, marked as "s" on FIG. 1A. Typically, spectra are obtained from thin samples that yield a strong un-scattered signal, 127, with zero energy-loss and non-zero energy-loss features, such as 128, that rapidly decrease in intensity with increasing energy-loss. After acquisition, the data obtained across height s on the two-dimensional sensor is typically collapsed into one-dimension to yield a plot of signal intensity against energy-loss. Often, multiple such spectra are taken in series for different incident positions of electron probes at the specimen 112 to build-up a so-called spectrum image data set (spectrum versus electron probe position).

Consistent with embodiments described herein, spectrum exposure occurs to a first portion of the two-dimensional (2D) imaging array 125 at the same time as read-out of a second portion of the image array. In particular, the spectrum is deflected in the non-dispersive y-direction at various points in time in synchrony with the read-out. The deflections are performed in a way that ensures the spectrum exposure is always happening on a region of the imaging array that is not being read out.

Figure 3:
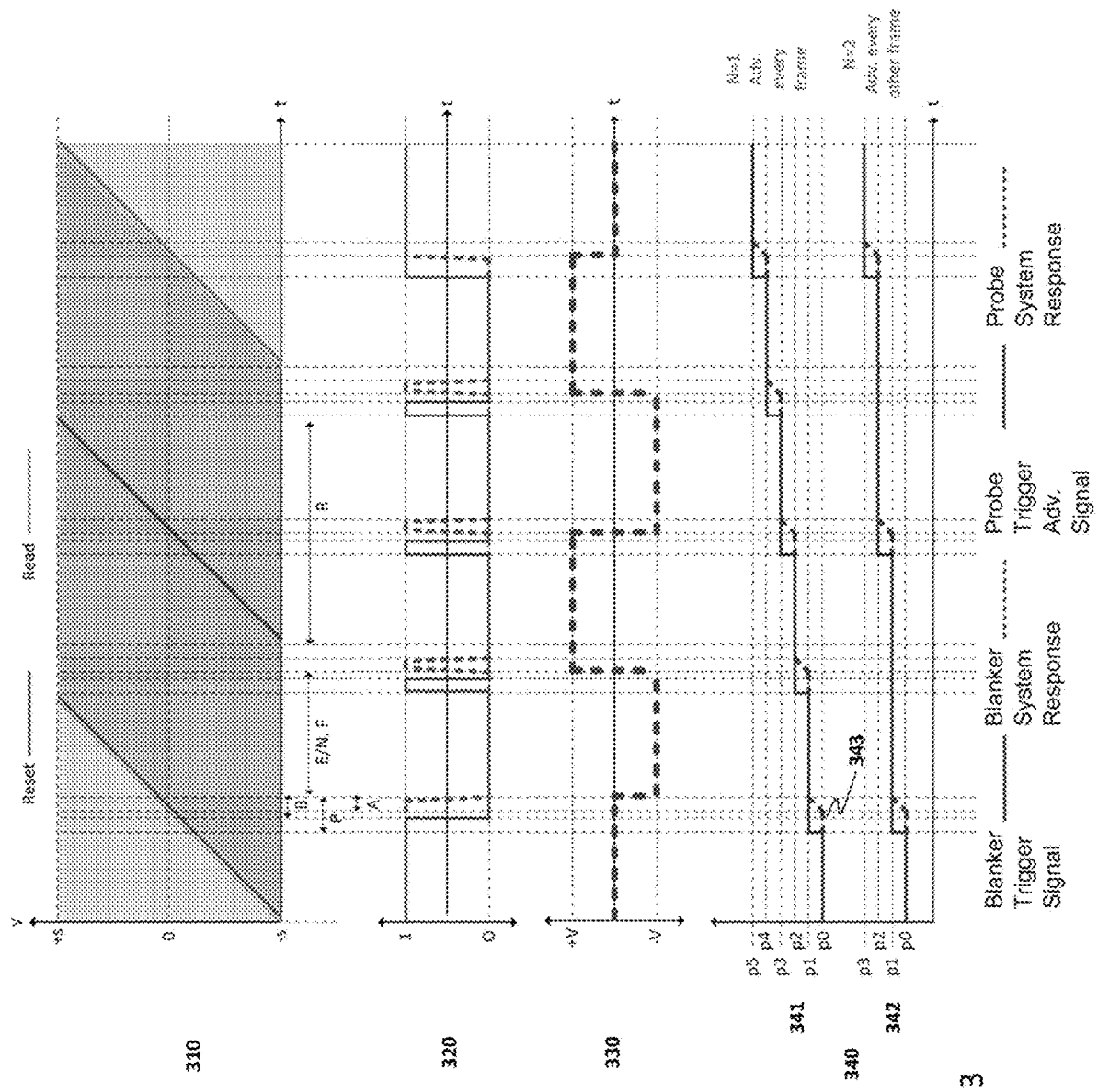
FIG. 3 is an exemplary EELS imaging sensor timing diagram according to an aspect of the invention.
Figure 3A:
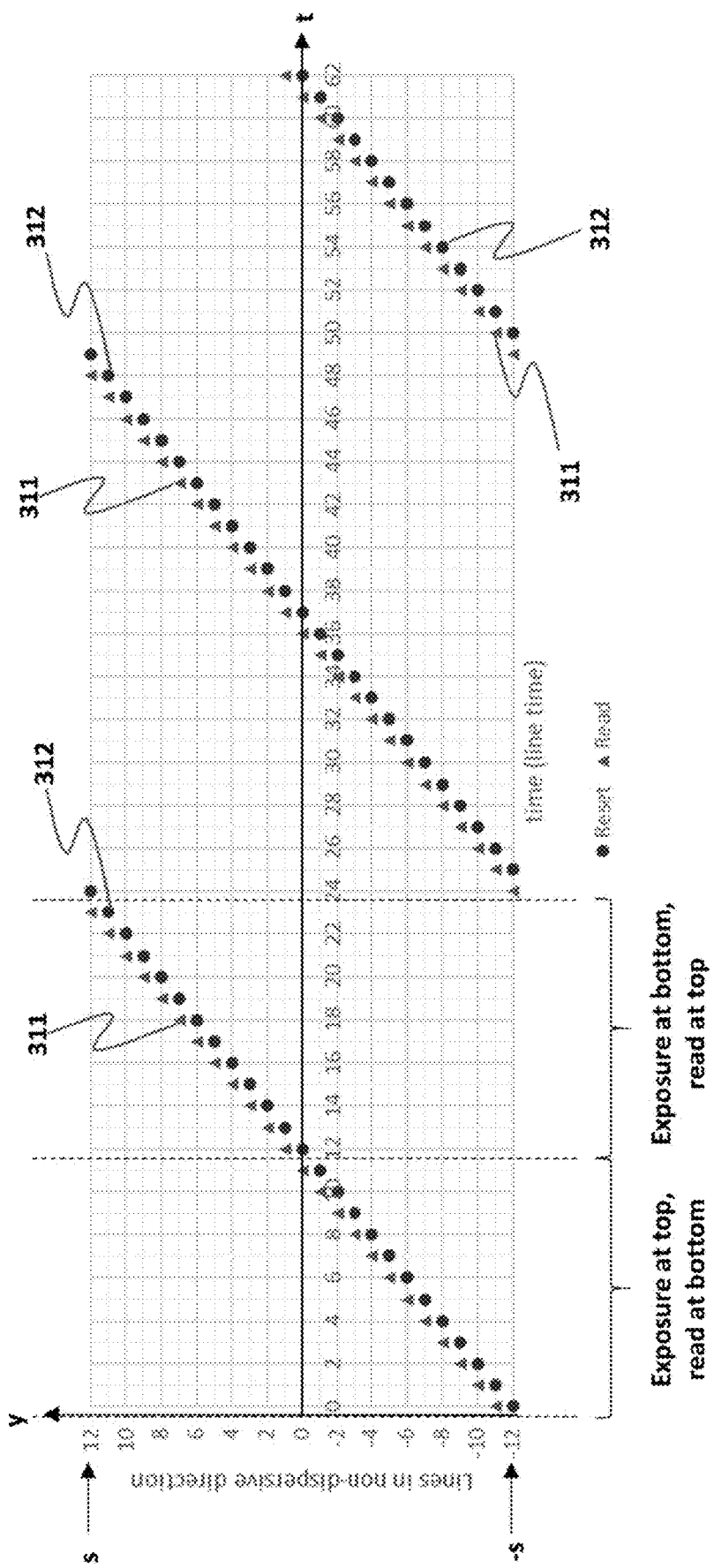
FIG. 3A is an enlarged view of the read/reset/expose portion of FIG. 3.

An illustrative case is that of a CMOS imaging array using a rolling-read mechanism. In this common architecture, rows are read in sequence across the sensor within a region of interest (ROI) and, row-by-row are subsequently reset to begin the next exposure of each row. FIG. 3A shows row reads 311 and resets 312 for two-and-a-half reads of an ROI of height 2s rows. The imaging array is oriented so the slow direction of read is in the y (non-dispersive) direction of the EELS spectrum as shown in FIG. 1A. Another way to describe this is that rows in the x direction are read one at a time, thus a row read is quick while each successive row is read only after the previous one and, thus, the y direction is relatively slow to be read.

In an embodiment of the invention, each spectrum exposure is shifted across the sensor in steps such that the exposed region is never a region that is being simultaneously read-out. FIG. 3 shows the case where the spectrum position is toggled in the y-direction such that the first half of the sensor (represented by Y axis range from −s to 0) is exposed while the second half (y axis range 0 to +s) is read-out and vice-versa. By doing this, the duty cycle is now only limited by the time it takes to shift the spectrum across the sensor, not by the speed of the read-out. The time to shift the spectrum should be a non-exposure time, since the spectrum is not settled in either portion of the imaging array during this time. This time is shown as the sloped portion 343 of the probe system response time in the penultimate chart 341 in FIG. 3.

Top chart 310 of FIG. 3 shows read-out and exposure of an image sensor as a function of sensor array axis y (non-dispersive direction) and time. The spectrum height is s pixels, the read-out time is R and the exposure time is E. Second chart 320 illustrates a beam blanking trigger signal (solid line) and delayed blanker system response (dashed line). The third chart down 330 shows the EELS spectrum shift response The voltage applied to the spectrum deflectors 124 determines the position of the spectrum in the non-dispersive, y, direction. The labels: +V and −V represent a shift of 2V, sufficient to shift the spectrum between top and bottom portions of the detector. Chart 340 in FIG. 3 illustrates two microscope electron probe advance trigger signals (solid lines) and the corresponding probe advance system responses (dashed lines), one set for probe advance every frame 341 and one set for probe advance every other frame 342. This illustrates two possibilities for probe-advance timing. Only one such scenario would be chosen per set of EELS spectra acquisitions. For both blanking and probe advance, the delayed system responses represent latencies in the system electronics and electron optics that may cause the system response to lag the relevant signals commanding a relevant change in state. In this embodiment, the spectrum is shifted in y such that the half of the sensor being read is never the same as the half being exposed. The beam is blanked and the spectrum shifted in a time, B. The duty cycle is E/(E+B). Typically B<<R.

Figure 4:
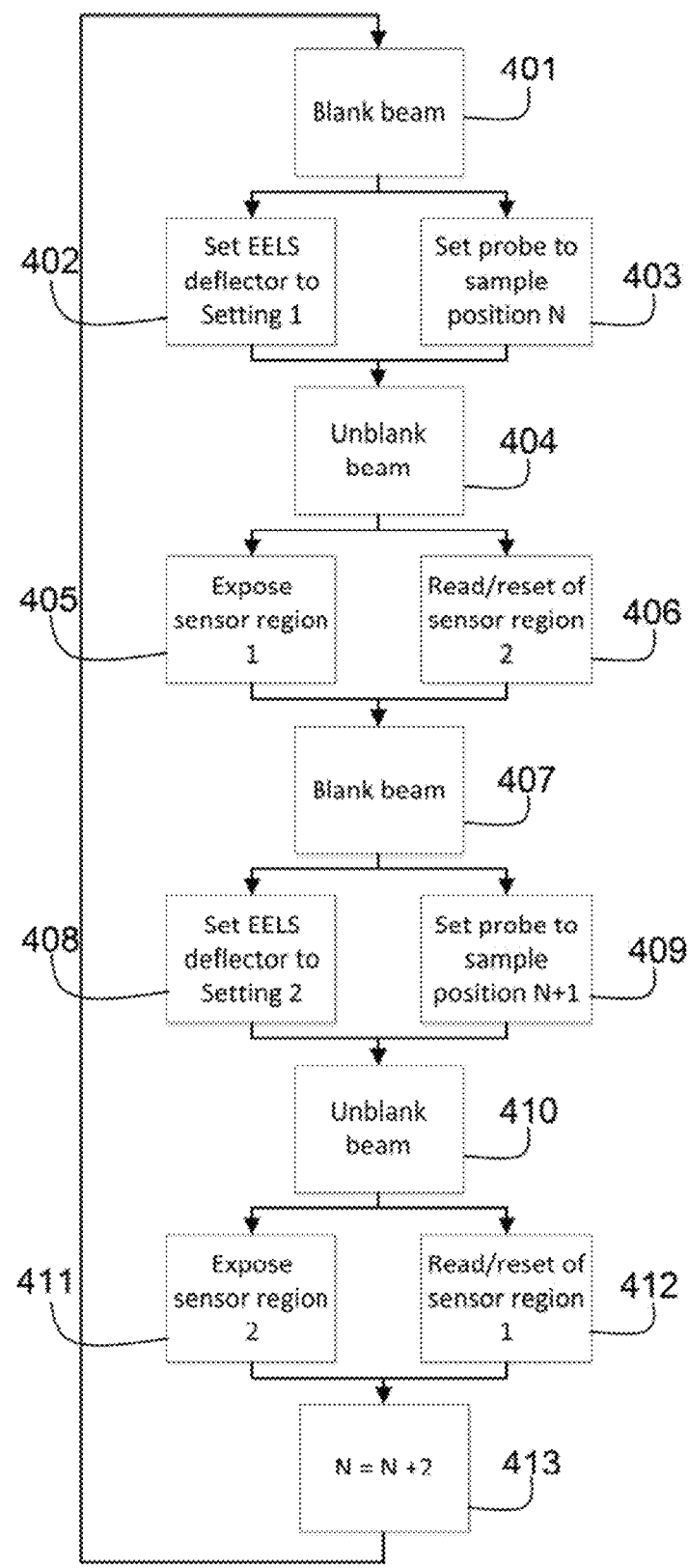
FIG. 4 is a flowchart of an exemplary EELS system according to an aspect of the invention.

FIG. 4 shows an exemplary process that can be used to perform exposure and acquisition timing as described above for FIGS. 3 and 3A. Consistent with embodiments described herein, the process of FIG. 4 may be implemented by a TEM EELS system, such as that described above in relation to FIG. 1. At step 401 an electron beam is blanked in preparation for deflecting the EELS spectrum to a portion of an imaging array. At step 402, the EELS deflector positions the EELS spectrum toward a first portion of the imaging array (Setting 1). Optionally, at step 403, while the beam is blanked, and at least in part simultaneously with the change in the EELS deflector of step 402, the beam deflector can also be adjusted to deflect the probe beam to a new position N on the sample. At step 404, the beam is un-blanked, causing the first sensor portion to be exposed at step 405. At least in part simultaneously with exposure of the first sensor portion, a second sensor portion is read out and reset at step 406. At step 407, the beam is blanked in preparation for deflecting the EELS spectrum to another portion of the imaging array. At step 408, the EELS deflector positions the EELS spectrum to a second portion of the imaging array (Setting 2). Optionally, at step 409, while the beam is blanked, and at least in part simultaneously with the change in the EELS deflector of step 408, the beam deflector can also be adjusted to deflect the probe beam to a new position N+1 on the sample. At step 410, the beam is un-blanked, causing the second sensor portion to be exposed at step 411. At least in part simultaneously with exposure of the second sensor portion, the first sensor portion is read out and reset at step 412. At step 413, the probe position is incremented.

Figure 5:
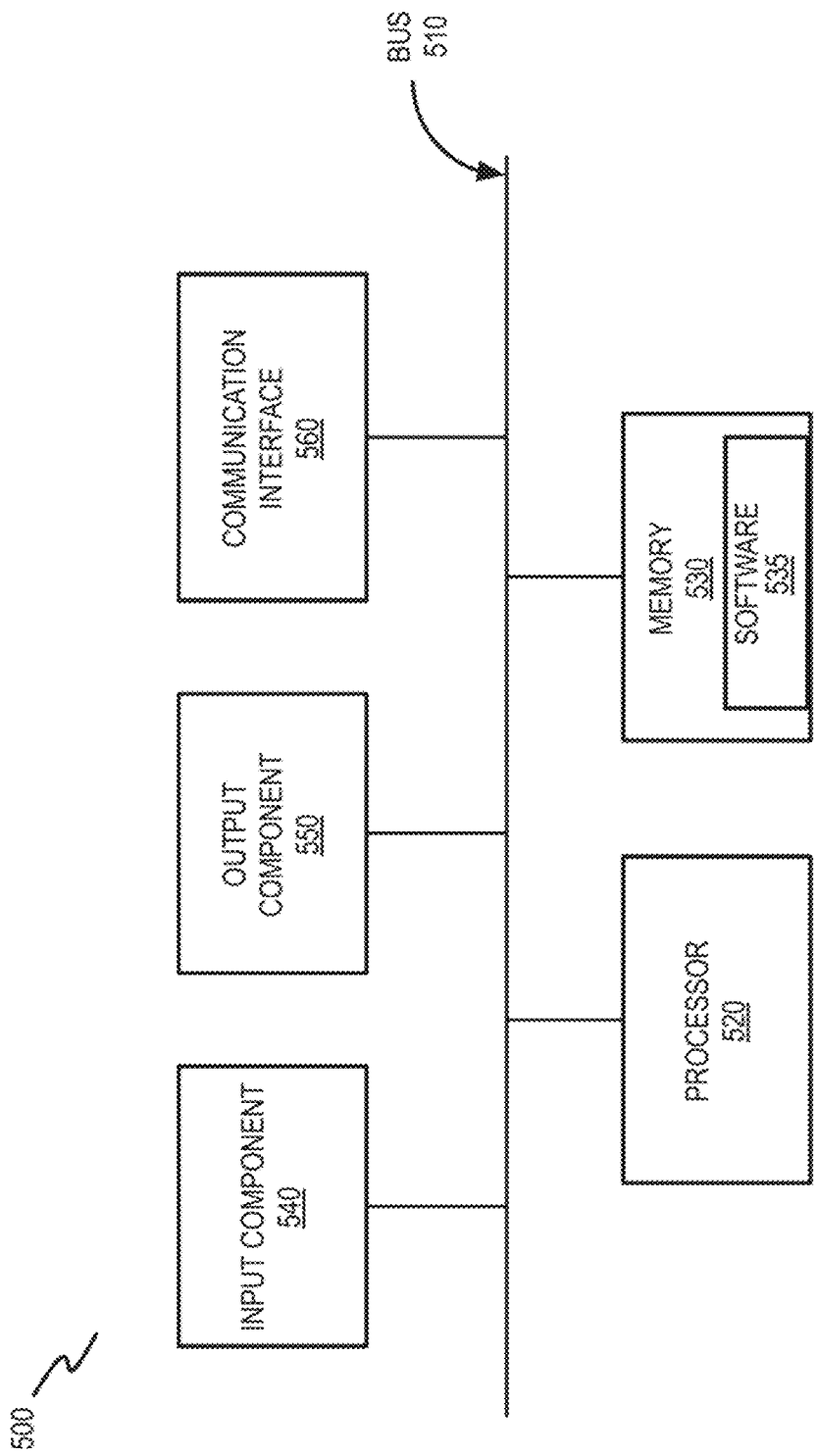
FIG. 5 is an exemplary computing system for controlling one or more components of the exemplary system of FIG. 1.

FIG. 5 is a diagram illustrating exemplary physical components of a device 500. Device 500 may correspond to various devices within the above-described system, such as microcontroller or computer 126 in FIG. 1. Device 500 may include a bus 510, a processor 520, a memory 530, an input component 540, an output component 550, and a communication interface 560.

Bus 510 may include a path that permits communication among the components of device 500. Processor 520 may include a processor, a microprocessor, or processing logic that may interpret and execute instructions. Memory 530 may include any type of dynamic storage device that may store information and instructions, for execution by processor 520, and/or any type of non-volatile storage device that may store information for use by processor 520.

Software 535 includes an application or a program that provides a function and/or a process. Software 535 is also intended to include firmware, middleware, microcode, hardware description language (HDL), and/or other form of instruction. By way of example, with respect to the network elements that include logic to provide proof of work authentication, these network elements may be implemented to include software 535. Additionally, for example, device 500 may include software 535 to perform tasks as described above with respect to FIG. 4.

Input component 540 may include a mechanism that permits a user to input information to device 500, such as a keyboard, a keypad, a button, a switch, etc. Output component 550 may include a mechanism that outputs information to the user, such as a display, a speaker, one or more light emitting diodes (LEDs), etc.

Communication interface 560 may include a transceiver that enables device 500 to communicate with other devices and/or systems via wireless communications, wired communications, or a combination of wireless and wired communications. For example, communication interface 560 may include mechanisms for communicating with another device or system via a network. Communication interface 560 may include an antenna assembly for transmission and/or reception of RF signals. In one implementation, for example, communication interface 560 may communicate with a network and/or devices connected to a network. Alternatively or additionally, communication interface 560 may be a logical component that includes input and output ports, input and output systems, and/or other input and output components that facilitate the transmission of data to other devices.

Device 500 may perform certain operations in response to processor 520 executing software instructions (e.g., software 535) contained in a computer-readable medium, such as memory 530. A computer-readable medium may be defined as a non-transitory memory device. A non-transitory memory device may include memory space within a single physical memory device or spread across multiple physical memory devices. The software instructions may be read into memory 530 from another computer-readable medium or from another device. The software instructions contained in memory 530 may cause processor 520 to perform processes described herein. Alternatively, hardwired circuitry may be used in place of or in combination with software instructions to implement processes described herein. Thus, implementations described herein are not limited to any specific combination of hardware circuitry and software.

Device 500 may include fewer components, additional components, different components, and/or differently arranged components than those illustrated in FIG. 5. As an example, in some implementations, a display may not be included in device 500. In these situations, device 500 may be a "headless" device that does not include input component 540. As another example, device 500 may include one or more switch fabrics instead of, or in addition to, bus 510. Additionally, or alternatively, one or more components of device 500 may perform one or more tasks described as being performed by one or more other components of device 500.

Existing microscope and EELS systems have the ability to perform a spectrum blanking cycle, a spectrum deflection and an electron probe shift all in the order of one microsecond or faster and synchronized precisely with one another, approximately three orders of magnitude faster than the read-out of the image sensor. Duty cycle is therefore close to 100% at spectrum acquisition rates of 1000 spectra per second and does not degrade significantly until the spectrum acquisition rate is 100,000 spectra per second or more. In this way, the spectrum read from each region of the sample in a spectrum image remains very pure in the sense that the spectrum obtained at probe position N has no/negligible information from positions N−1, N+1 because the electron beam is blanked during both shift of the probe in the microscope and shift of the EELS spectrum to the region of the sensor not undergoing read-out, thus preventing any exposure on the sensor during the slew of the probe between points or slew of the EELS spectrum convolved with the sensor read-out process.

Depending on the spectrum rate, read-out time, and number of pixels to be read out, embodiments described herein can include more movements of spectra across the sensor in the non-dispersive direction than the toggling motion shown in FIG. 3. For a rolling-read architecture the general process would involve N steps with period T, such that a y region equal to the height that can be read-out in time T is exposed at each step. The position of the spectrum exposure area would always be some number of steps before the read out of the region.

For image sensors that do not perform a rolling read as shown in FIG. 3, other embodiments of the invention can be considered with differing deflecting motions of the spectrum. The common requirements are an imaging sensor that can be exposed in one region at the same time as being read-out in another, and a pre-sensor-deflector that is fast in comparison to the read time of the sensor.

Although different implementations have been described above, it is expressly understood that it will be apparent to persons skilled in the relevant art that the implementations may be modified without departing from the spirit of the invention. Various changes of form, design, or arrangement may be made to the invention without departing from the spirit and scope of the invention. Therefore, the above mentioned description is to be considered exemplary, rather than limiting, and the true scope of the invention is that defined in the following claims.

It should be emphasized that the term "comprises/comprising" when used in this specification is taken to specify the presence of stated features, integers, steps or components but does not preclude the presence or addition of one or more other features, integers, steps, components, or groups thereof.

No element, act, or instruction used in the present application should be construed as critical or essential to the implementations described herein unless explicitly described as such. Also, as used herein, the article "a" is intended to include one or more items. Further, the phrase "based on" is intended to mean "based, at least in part, on" unless explicitly stated otherwise.

What is claimed is:

1. A method for acquiring a plurality of electron energy loss spectra of a specimen comprising:
   exposing a first portion of the specimen to an electron beam at an electron probe incident position;
   dispersing by energy level electrons transmitted by the specimen with a prism so as to create a first electron energy loss spectrum;
   exposing a first portion of a two-dimensional imaging array to said first electron energy loss spectrum;
   at least in part simultaneously with said exposing step, reading-out a signal of a second portion of said two-dimensional imaging array that was previously exposed;
   exposing said second portion of said two-dimensional imaging array to a second electron energy-loss spectrum using an electron-optical deflecting element having a plurality of positions; and
   at least in part simultaneously with said exposure of said second portion of said two-dimensional imaging array, reading-out a signal of said first portion of said two-dimensional imaging array.

2. The method of claim 1, further comprising:
   resetting pixels of said first portion of said two-dimensional imaging array subsequent to said reading out the signal of said first portion of said two-dimensional imaging array and at least in part simultaneously with said exposing of said second portion of said two-dimensional imaging array; and
   resetting pixels of said second portion of said two-dimensional imaging array subsequent to said reading out the signal of said second portion of said two-dimensional imaging array at least in part simultaneously with said exposing of said first portion of said two-dimensional imaging array.

3. The method of claim 1, further comprising blanking said electrons transmitted by the specimen with an electron-optical blanking system while said electron-optical deflecting element is between positions.

4. The method of claim 3 wherein said blanking timing is performed with a fast, electrostatic electron optical blanker.

5. The method of claim 1 wherein said electron-optical deflecting element is a fast, electrostatic electron optical deflector.

6. The method of claim 1, further comprising:
   changing said electron probe incident position simultaneously with said step of exposing said first or second portion of said two-dimensional imaging array to said first or second electron energy loss spectrum respectively.

7. The method of claim 6, wherein electron probe incident position is performed with fast probe scan electron optics.

8. The method of claim 6, wherein changing said electron probe incident position simultaneously with said step of exposing said first or second portion of said two-dimensional imaging array to said first or second electron energy loss spectrum, respectively, does not occur every time said step of exposing said first or second portion of said two-dimensional imaging array to said first or second electron energy loss spectrum respectively is performed.

9. The method of claim 1, further comprising:
   exposing additional portions of said two-dimensional imaging array such that at least one portion of said imaging array is read out at least in part simultaneously with exposure of another portion of said imaging array.

10. The method of claim 1 wherein said imaging array is either directly exposed to said electron energy loss spectrum or is exposed to a light image of said electron energy loss spectrum via a scintillator.

11. A system for acquiring a plurality of electron energy loss spectrum images of a specimen comprising:
    an electron beam generator configured to generate an electron beam;
    an electron beam deflector;
    a prism;
    projecting electron-optics;
    a two-dimensional imaging array;
    an electron-optical deflector having a plurality of positions; and
    a system controller; wherein said system controller is configured to:
      cause said electron beam deflector to expose a first portion of the specimen to the electron beam at an electron probe incident position,
      whereby electrons passing through said specimen to said prism create a first electron energy loss spectrum;
      cause said electron-optical deflector to expose a first portion of a two-dimensional imaging array to said first electron energy loss spectrum;
      at least in part simultaneously with said exposure of said first portion of said two-dimensional imaging array, read-out a signal of a second portion of said two-dimensional imaging array that was previously exposed;
      cause said electron-optical deflector to redirect electrons exiting said prism so as to expose said second portion of said two-dimensional imaging array with a second electron energy loss spectrum;
      at least in part simultaneously with said exposure of said second portion of said two-dimensional imaging array, read-out a signal of said first portion of said two-dimensional imaging array.

12. The system of claim 11, further comprising:
    an electron-optical blanking system,
    wherein said system controller is further configured to cause said electron-optical blanking system to blank said electrons transmitted by the specimen when said electron-optical deflector is between positions.

13. The system of claim 12, wherein said electron-optical blanking system is a fast, electrostatic electron optical blanker.

14. The system of claim 11, wherein said electron-optical deflector is a fast, electrostatic electron optical deflector.

15. The system of claim 11, wherein said system controller is further configured to cause said electron beam deflector to change said electron probe incident position simultaneously with causing said electron-optical deflector to change position.

16. The system of claim 11, wherein said electron beam deflector comprises fast probe scan electron optics.

17. The system of claim 16, wherein said system controller is further configured to cause said electron beam deflector to change said electron probe incident position simultaneously with changing position of said electron-optical deflector less frequently than every change of said electron-optical deflector.

18. The system of claim 11, wherein said system controller is further configured to cause said electron-optical deflector to expose additional portions of said two-dimensional imaging array such that at least one portion of said imaging array is read out at least in part simultaneously with exposure of another portion of said imaging array.

19. The system of claim 11 wherein said imaging array is either directly exposed to said electron energy loss spectrum or is exposed to a light image of said electron energy loss spectrum via a scintillator.

\* \* \* \* \*